(12) United States Patent
Yamamoto et al.

(10) Patent No.: US 8,319,582 B2
(45) Date of Patent: Nov. 27, 2012

(54) ELASTIC WAVE APPARATUS AND DUPLEXER

(75) Inventors: Ayaka Yamamoto, Nagaokakyo (JP); Yuichi Takamine, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/306,018

(22) Filed: Nov. 29, 2011

(65) Prior Publication Data

US 2012/0068788 A1 Mar. 22, 2012

Related U.S. Application Data

(63) Continuation of application No. PCT/JP2010/057895, filed on May 10, 2010.

(30) Foreign Application Priority Data

Jun. 4, 2009 (JP) .................................. 2009-135265

(51) Int. Cl.
*H03H 9/72* (2006.01)
*H03H 9/64* (2006.01)
(52) U.S. Cl. ......................... 333/133; 333/193; 333/195
(58) Field of Classification Search .................. 333/133, 333/193–196; 310/313 B, 313 D
See application file for complete search history.

(56) References Cited

U.S. PATENT DOCUMENTS

| | | | | |
|---|---|---|---|---|
| 6,809,614 B2 * | 10/2004 | Fujii et al. | ...................... | 333/193 |
| 7,053,733 B2 * | 5/2006 | Yata et al. | ...................... | 333/195 |
| 2001/0043024 A1 | 11/2001 | Takamine et al. | | |
| 2009/0289740 A1 | 11/2009 | Takamine | | |
| 2011/0109400 A1 | 5/2011 | Koga et al. | | |

FOREIGN PATENT DOCUMENTS

| | | | |
|---|---|---|---|
| JP | 2002-084165 A | | 3/2002 |
| JP | 2003-258597 A | | 9/2003 |
| JP | 2007-123992 | * | 5/2007 |
| JP | 2008-118277 A | | 5/2008 |
| WO | 2008/108113 A1 | | 9/2008 |
| WO | 20091028683 A1 | | 3/2009 |

OTHER PUBLICATIONS

English language machine translation of JP 2003-258597, published Sep. 12, 2003.*
Official Communication issued in International Patent Application No. PCT/JP2010/057895, mailed on Jun. 22, 2010.

* cited by examiner

*Primary Examiner* — Barbara Summons
(74) *Attorney, Agent, or Firm* — Keating & Bennett, LLP

(57) ABSTRACT

An elastic wave apparatus includes a balanced-unbalanced transforming function, and an elastic wave filter and a multi-layer wiring board on which the elastic wave filter is mounted. The elastic wave filter includes an unbalanced terminal and first and second balanced terminals. External electrodes used are provided on the multilayer wiring board. A first internal line connects the first balanced terminal and the external electrode. A second internal line connects the second balanced terminal and the external electrode. The lengths or shapes of the first internal line and the second internal line are set so that a capacitance used for the improvement of a balance is generated in an adjacent area A where the first internal line and the second internal line are adjacent to each other. In the adjacent area A, the directions of currents passing through the first internal line and the second internal line are the same.

5 Claims, 9 Drawing Sheets

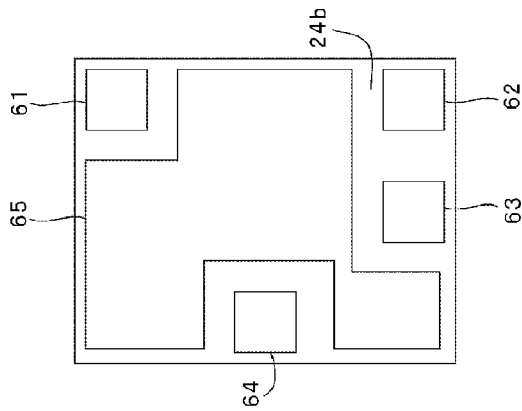
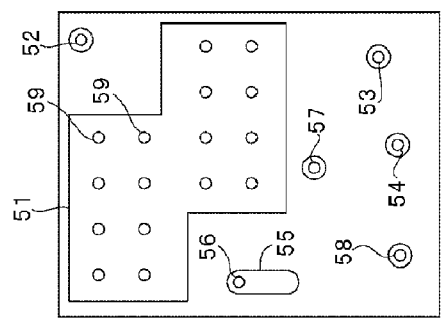
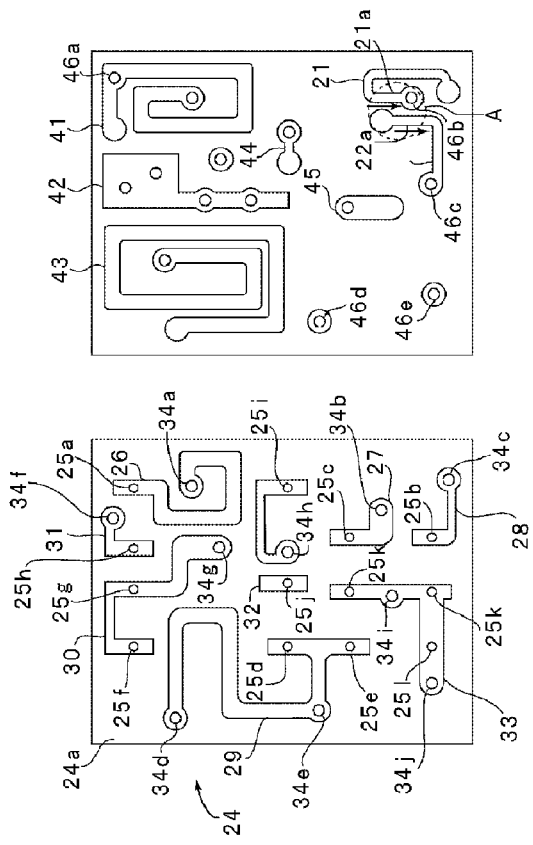

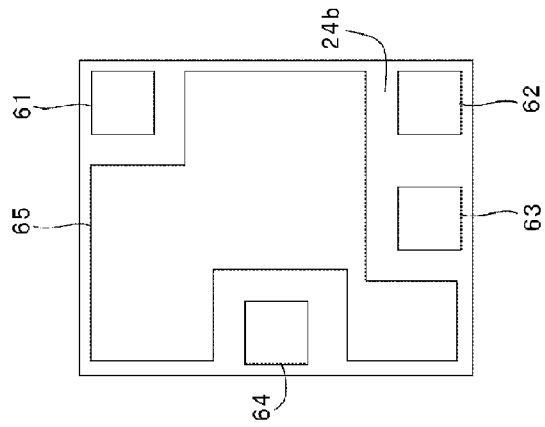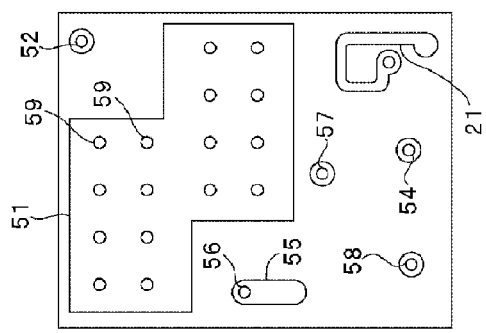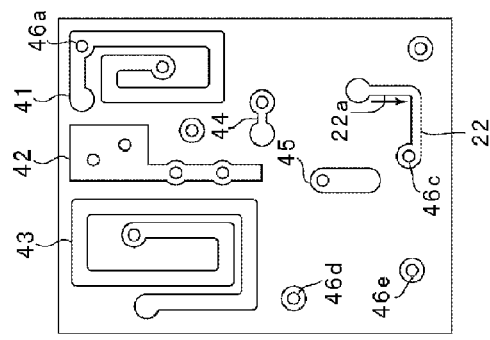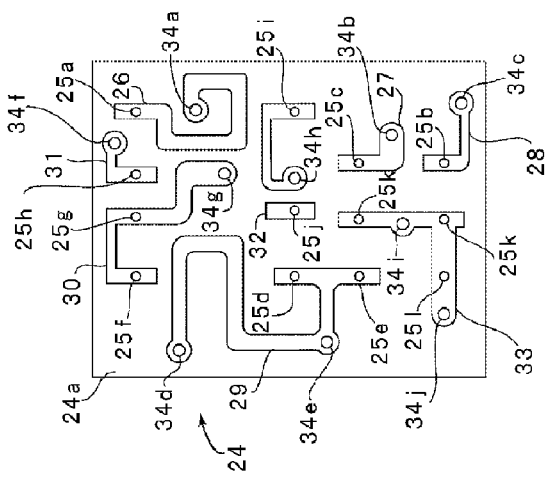

ELASTIC WAVE APPARATUS AND DUPLEXER

BACKGROUND OF THE INVENTION

1. Field of the Invention

The present invention relates to elastic wave apparatuses in which an elastic wave filter element used as a bandpass filter is disposed on a multilayer wiring board, and, more particularly, to an elastic wave apparatus including a balanced-unbalanced transforming function and a duplexer including the elastic wave apparatus.

2. Description of the Related Art

Elastic wave apparatuses such as surface acoustic wave filters have been recently used as, for example, bandpass filters in RF stages of mobile telephones.

Japanese Unexamined Patent Application Publication No. 2002-84165 discloses a surface acoustic wave apparatus as an example of such an elastic wave apparatus.

FIG. 10 is a schematic plan view illustrating an electrode structure of a surface acoustic wave apparatus disclosed in Japanese Unexamined Patent Application Publication No. 2002-84165. A surface acoustic wave apparatus 1001 is obtained by forming illustrated electrodes on a piezoelectric substrate. The surface acoustic wave apparatus 1001 includes an unbalanced terminal 1002, a first balanced terminal 1003, and a second balanced terminal 1004, and has a balanced-unbalanced transforming function.

In the surface acoustic wave apparatus 1001, a first longitudinally coupled resonator-type surface acoustic wave filter 1005 and a second longitudinally coupled resonator-type surface acoustic wave filter 1006 are cascade-connected. The first surface acoustic wave filter 1005 includes a first IDT 1005a, a second IDT 1005b, and a third IDT 1005c which are disposed along a surface acoustic wave propagation direction. The second surface acoustic wave filter 1006 includes a first IDT 1006a, a second IDT 1006b, and a third IDT 1006c which are disposed along a surface acoustic wave propagation direction. A reflector 1005d is disposed on one side of an area where the first IDT 1005a to the third IDT 1005c are disposed in the surface acoustic wave propagation direction, and a reflector 1005e is disposed on the other side of the area. The second surface acoustic wave filter 1006 also includes reflectors 1006d and 1006e.

One end of the second IDT 1005b is connected to the unbalanced terminal 1002. One end of the first IDT 1005a is connected to one end of the first IDT 1006a via a first line 1007. One end of the third IDT 1005c is connected to one end of the third IDT 1006c via a capacitor 1008. One end of the second IDT 1006b is connected to the first balanced terminal 1003, and the other end of the second IDT 1006b is connected to the second balanced terminal 1004. That is, a pair of balanced outputs are obtained from the second surface acoustic wave filter 1006 of a floating balanced type.

In the surface acoustic wave apparatus 1001, a capacitor 1008 is connected between the first balanced terminal 1003 and the second balanced terminal 1004. The capacitor 1008 corrects the difference in frequency characteristic between balanced signals obtained from the first balanced terminal 1003 and the second balanced terminal 1004. As a result, an amplitude balance and a phase balance can be improved.

Japanese Unexamined Patent Application Publication No. 2002-84165 also discloses a configuration illustrated in FIG. 11 in addition to a case in which an external capacitor element is used as the capacitor 1008. FIG. 11 is a schematic bottom cross-sectional view of a die attach portion in a package 1009. In the die attach portion in the package 1009, electrodes 1010a to 1010d are formed to establish external electric connection. The electrodes 1010c and 1010d are electrically connected to the first balanced terminal 1003 and the second balanced terminal 1004, respectively. The electrodes 1010c and 1010d are adjacent to each other, so that the capacitor 1008 is formed with a capacitance generated between the electrodes 1010c and 1010d.

When the surface acoustic wave apparatus 1001 is used as a receiver bandpass filter in a duplexer in a mobile telephone, a transmitter bandpass filter is also disposed in the package 1009. Accordingly, when the size of the package 1009 is reduced, it is difficult to freely dispose the electrodes 1010c and 1010d in the die attach portion. It is therefore difficult to obtain a sufficient capacitance. That is, it is difficult to obtain sufficient capacitance to improve the balance between the electrodes 1010c and 1010d.

Furthermore, when the size of the package 1009 is reduced, it is difficult to freely dispose electrodes and lines in a piezoelectric substrate and freely determine the positions of the first balanced terminal 1003 and the second balanced terminal 1004. It is therefore difficult to symmetrically dispose balanced signal lines that are individually connected to the first balanced terminal 1003 and the second balanced terminal 1004. This may lead to deterioration in balance.

SUMMARY OF THE INVENTION

Preferred embodiments of the present invention provide an elastic wave apparatus that significantly improves the balance between signals obtained from first and second balanced terminals while achieving size reduction and a duplexer including the elastic wave apparatus.

According to a preferred embodiment of the present invention, an elastic wave apparatus includes a longitudinally coupled resonator-type elastic wave filter element including an unbalanced terminal, a first balanced terminal, a second balanced terminal, and a ground terminal, a multilayer wiring board including an undersurface and a surface on which the elastic wave filter element is mounted by a face-down method, a plurality of electrodes that are provided on the surface of the multilayer wiring board and are individually connected to the unbalanced terminal, the first and second balanced terminals, and the ground terminal in the elastic wave filter element, a plurality of external electrodes provided on the undersurface of the multilayer wiring board, and a plurality of internal lines that are provided in the multilayer wiring board and individually electrically connect the plurality of electrodes and the plurality of external electrodes. The plurality of internal lines include a first internal line connected to the first balanced terminal and a second internal line connected to the second balanced terminal. Lengths and/or shapes of the first and second internal lines are different so as to improve a balance between a signal obtained from the first balanced terminal and a signal obtained from the second balanced terminal. A capacitance component is generated in an adjacent area where portions of the first and second internal lines are adjacent to each other. A direction of a current passing through the first internal line and a direction of a current passing through the second internal line are the same in the adjacent area.

In an elastic wave apparatus according to a preferred embodiment of the present invention, the adjacent area is located on one of insulating layers in the multilayer wiring board. In this case, since the adjacent area can be provided without increasing the thickness of the multilayer wiring board, it is possible to reduce the size of the elastic wave apparatus.

In an elastic wave apparatus according to a preferred embodiment of the present invention, the first and second internal lines are adjacent to each other with at least one of the insulating layers therebetween to define the adjacent area. In this case, since the dimension of the adjacent area along the surface of the multilayer wiring board can be reduced, it is possible to reduce the size of the multilayer wiring board.

In an elastic wave apparatus according to a preferred embodiment of the present invention, the elastic wave filter element may be a floating balanced type elastic wave filter element or an elastic wave filter element of another balanced type. When a floating balanced type elastic wave filter element is reduced in size, a balance is prone to be deteriorated. According to a preferred embodiment of the present invention, in an elastic wave apparatus including a floating balanced type elastic wave filter element, it is possible to more effectively prevent the deterioration of a balance.

In an elastic wave apparatus according to a preferred embodiment of the present invention, the elastic wave filter element may be a surface acoustic wave filter element or a boundary acoustic wave filter element using a boundary acoustic wave.

A duplexer according to a preferred embodiment of the present invention includes a transmitter filter and a receiver filter that is an elastic wave apparatus according to another preferred embodiment of the present invention.

According to a preferred embodiment of the present invention, in order to prevent the deterioration of a balance between signals at the first and second balanced terminals, an adjacent area in which portions of the first and second internal lines are adjacent to each other is provided. In the adjacent area, the lengths and/or shapes of the first and second internal lines are different and the directions of currents passing through the first and second internal lines are the same. Accordingly, it is possible to effectively prevent the deterioration of a balance between signals at the first and second balanced terminals while achieving size reduction. A balance can be therefore improved.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 1A to 1D are schematic plan views describing electrode structures on the main surface of a multilayer wiring board, the top surface of a second insulating layer, the top surface of a third insulating layer, and the second surface of the third insulating layer, respectively, in an elastic wave apparatus according to a first preferred embodiment of the present invention.

FIGS. 8A to 8D are schematic plan views describing electrode structures on the main surface of a multilayer wiring board, the top surface of a second insulating layer, the top surface of a third insulating layer, and the second surface of the third insulating layer, respectively, in an elastic wave apparatus according to a second preferred embodiment of the present invention.

DETAILED DESCRIPTION OF THE PREFERRED EMBODIMENTS

Preferred embodiments of the present invention will be described in detail below with reference to the accompanying drawings.

Figure 2:
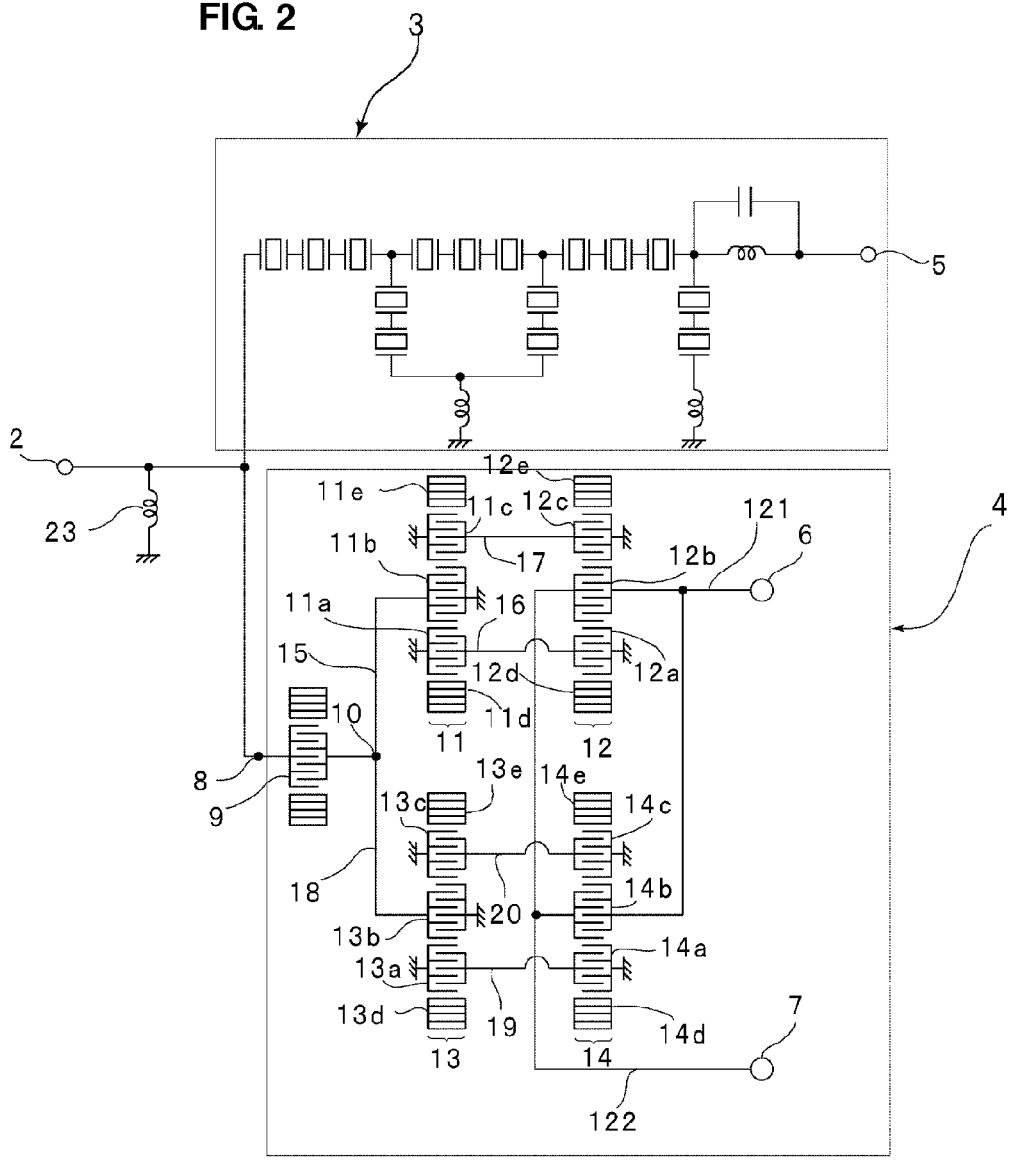
FIG. 2 is a schematic circuit diagram of a duplexer that includes an elastic wave apparatus according to the first preferred embodiment of the present invention as a receiver bandpass filter.

FIG. 2 is a schematic circuit diagram illustrating the circuit configuration of a duplexer including a surface acoustic wave apparatus that is an elastic wave apparatus according to a first preferred embodiment of the present invention. As illustrated in FIG. 2, a duplexer 1 includes an antenna terminal 2 connected to an antenna. A first end of a transmitter filter 3 is connected to the antenna terminal 2, and a second end of the transmitter filter 3 is connected to a transmission terminal 5.

A first end of a receiver filter 4 is connected to the antenna terminal 2, and a second end of the receiver filter 4 is connected to a first balanced terminal 6 and a second balanced terminal 7.

The transmitter filter 3 according to this preferred embodiment preferably is a ladder filter, but is not limited thereto. That is, in the transmitter filter 3, a plurality of series arm resonators and a plurality of parallel arm resonators are connected to one another to define a ladder circuit.

An inductor 23 is connected between the antenna terminal 2 and a ground potential to achieve impedance matching.

One of the unique features of an elastic wave apparatus according to this preferred embodiment is a portion in which the receiver filter 4 is provided. The receiver filter 4 includes an unbalanced terminal 8 as an input terminal and the first balanced terminal 6 and the second balanced terminal 7 as output terminals. Accordingly, the receiver filter 4 is a balanced surface acoustic wave filter including a balanced-unbalanced transforming function.

A first end of a one-port elastic wave resonator 9 is connected to the unbalanced terminal 8, and a second end of the one-port elastic wave resonator 9 is connected to a node 10. A first longitudinally coupled resonator-type elastic wave filter 11 and a second longitudinally coupled resonator-type elastic wave filter 12 are cascade-connected between the node 10 and the balanced terminal 6. The first elastic wave filter 11 includes a first IDT 11a, a second IDT 11b, and a third IDT 11c which are arranged in this order along an elastic wave propagation direction. A reflector 11d is disposed on one side of an area where the first IDT 11a to the third IDT 11c are disposed in the elastic wave propagation direction, and a reflector 11e is disposed on the other side of the area. The second elastic wave filter 12 also includes a first IDT 12a, a second IDT 12b, a third IDT 12c, and reflectors 12d and 12e. A first end of the second IDT 11b is connected to a line 15.

First ends of the first IDT 11a and the third IDT 11c are connected to the ground potential. Second ends of the first IDT 11a is connected to a first end of the first IDT 12a via a line 16. The second end of the third IDT 11c is similarly connected to a first end of the third IDT 12c via a line 17. The second ends of the first IDT 12a and the third IDT 12c are connected to the ground potential. A first end of the second IDT 12b is connected to the first balanced terminal 6, and a second end of the second IDT 12b is connected to the second balanced terminal 7.

Accordingly, an elastic wave filter portion of a floating balanced type including a balanced-unbalanced transforming function is defined by the first elastic wave filter 11 and the second elastic wave filter 12.

Furthermore, in this preferred embodiment, a third elastic wave filter 13 and a fourth elastic wave filter 14 are connected in parallel to the first elastic wave filter 11 and the second elastic wave filter 12. The third elastic wave filter 13 and the fourth elastic wave filter 14 are also cascade-connected.

The configuration of each of the third elastic wave filter 13 and the fourth elastic wave filter 14 is similar to that of the first elastic wave filter 11 and the second elastic wave filter 12. That is, the third elastic wave filter 13 includes a first IDT 13a, a second IDT 13b, a third IDT 13c, and reflectors 13d and 13e. The fourth elastic wave filter 14 includes a first IDT 14a, a second IDT 14b, a third IDT 14c, and reflectors 14d and 14e. A first end of the second IDT 13b is connected to the node 10, and a second end of the second IDT 13b is connected to the ground potential. First ends of the first IDT 13a and the third IDT 13c are connected to the ground potential, and second ends of the first IDT 13a and the third IDT 13c are connected to first ends of the first IDT 14a and the third IDT 14c via lines 19 and 20, respectively. The second ends of the first IDT 14a and the third IDT 14c are connected to the ground potential.

A first end of the second IDT 14b is connected to the first balanced terminal 6, and a second end of the second IDT 14b is connected to the second balanced terminal 7. These connections are achieved by connecting first ends of the second IDTs 12b and 14b to the first balanced terminal 6 with a first balanced line 121 and connecting the second ends of the second IDTs 12b and 14b to the second balanced terminal 7 with a second balanced line 122.

Some of the unique features of the present preferred embodiment include that a first internal line 21 connected to the first balanced terminal 6 and a second internal line 22 connected to the second balanced terminal 7 are adjacent to each other in a multilayer wiring board to be described later so as to obtain a capacitance from an adjacent area where the first internal line 21 and the second internal line 22 are adjacent to each other, and the lengths and/or shapes of the first internal line 21 and the second internal line 22 are different so as to improve a balance. These features will be described in detail below.

Figure 3:
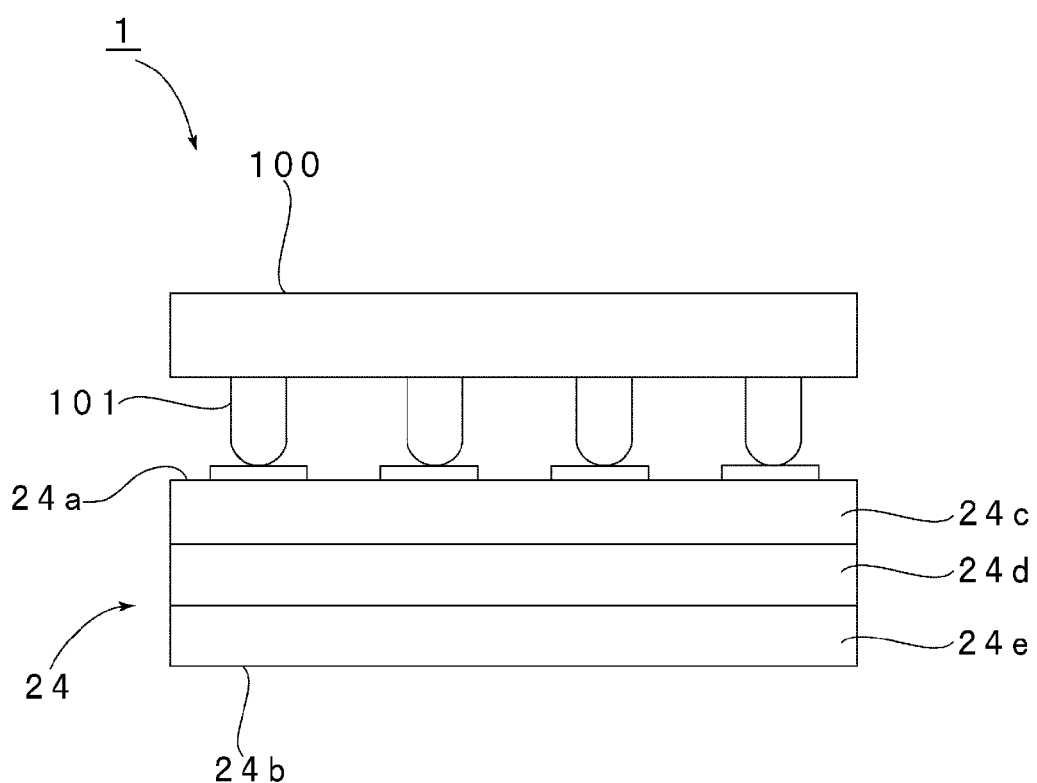
FIG. 3 is a schematic elevational view of a duplexer according to the first preferred embodiment of the present invention.
Figure 4D:
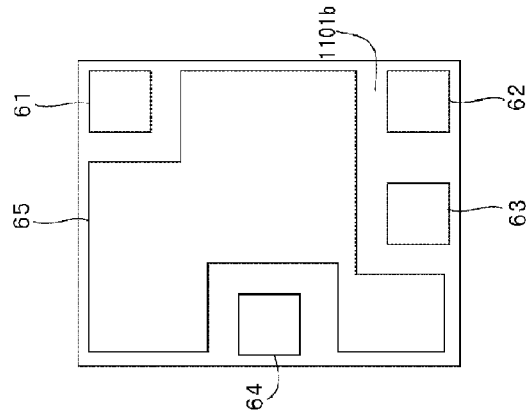
FIGS. 4A to 4D are schematic plan views illustrating electrode structures on the main surface of a multilayer wiring board, the top surface of a second insulating layer, the top surface of a third insulating layer, and the second surface of the third insulating layer, respectively, in an elastic wave apparatus that is a comparative example.
Figure 4C:
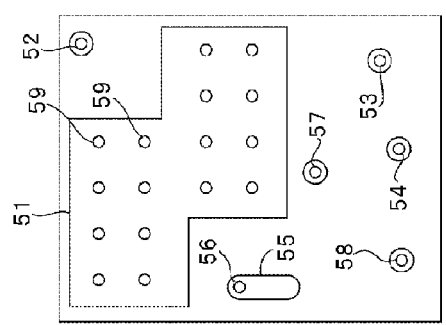
Figure 4B:
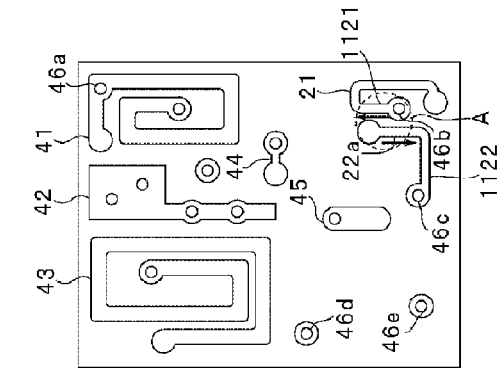
Figure 4A:
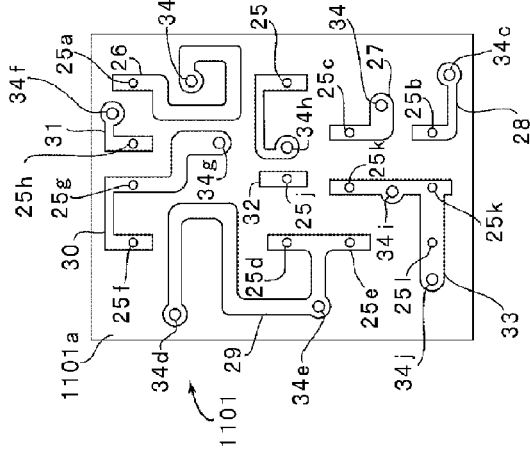

As illustrated in FIG. 3, the duplexer 1 according to the present preferred embodiment includes an elastic wave filter element on a main surface 24a of a multilayer wiring board 24 including a first insulating layer 24c, a second insulating layer 24d, and a third insulating layer 24e. An elastic wave filter element 100 is an elastic wave filter chip including the transmitter filter 3 and the receiver filter 4. On the second surface of the elastic wave filter element 100, a plurality of bumps 101 are provided. These bumps 101 are individually connected to the transmission terminal 5, the first balanced terminal 6, the second balanced terminal 7, the unbalanced terminal 8, and an electrode connected to the ground potential in the elastic wave filter element 100.

The multilayer wiring board 24 is obtained by laminating a plurality of insulating layers. These insulating layers are made of, for example, a synthetic resin or ceramic.

FIGS. 1A to 1D are schematic plan views illustrating electrode structures on the main surface of a multilayer wiring board, the top surface of a second insulating layer, the top surface of a third insulating layer, and the second surface of the multilayer wiring board, respectively. FIG. 1D is a schematic plan view illustrating an electrode structure on the second surface of a multilayer wiring board 24 as viewed not from the second surface but from the main surface of the multilayer wiring board 24.

On the main surface 24a, a small circle 25a represents a position at which a bump connected to the transmission terminal 5 of an elastic wave filter element is bonded, a circle 25b represents a position at which a bump connected to the first balanced terminal 6 is bonded, a circle 25c represents a position at which a bump connected to the second balanced terminal 7 is bonded, a circle 25d represents a position at which a bump connected to the output terminal of the transmitter filter 3 is bonded, a circle 25e represents a position at which a bump connected to the unbalanced terminal 8 is bonded, and other small circles 25f to 25l represent positions at which bumps connected to terminals connected to the ground potential of an elastic wave filter element are individually bonded.

As illustrated in the drawing, strip electrodes 26 to 33 each connected to one of the circles 25a to 25l are provided on the main surface 24a. Large circles in the electrodes 26 to 33 individually represent positions of via hole electrodes 34a to 34j that are formed in the first insulating layer and extend downward.

As illustrated in FIG. 1B, on the top surface of the second insulating layer, internal lines 41 to 45, a first internal line 21, and a second internal line 22 are formed by patterning an electrode material. The internal line 41 is connected to the transmission terminal 5. The internal line 41 is connected to the lower end of the via hole electrode 34a and the upper end of a via hole electrode 46a extending downward from the second insulating layer. The first internal line 21 is connected to the first balanced terminal 6. A first end of the first internal line 21 is connected to the lower end of the via hole electrode 34c, and a second end of the first internal line 21 is connected to the upper end of a via hole electrode 46b extending downward.

A first end of the second internal line 22 connected to the second balanced terminal 7 is connected to the lower end of the via hole electrode 34b, and a second end of the second internal line 22 is connected to the upper end of a via hole electrode 46c extending downward.

Another feature of the present preferred embodiment is that the first internal line 21 and the second internal line 22 are adjacent to each other in an adjacent area A illustrated in the drawing. As represented by arrows, the direction of a current passing through the first internal line 21 and the direction of a current passing through the second internal line 22 are the same in the adjacent area A.

The reason for this is that the first internal line 21 and the second internal line 22 have straight portions 21a and 21b, respectively, which are parallel to each other in the adjacent area A. In the present preferred embodiment, in the adjacent area A, a capacitance sufficient to improve a balance between signals at the first balanced terminal 6 and the second balanced terminal 7 is obtained between the first internal line 21 and the second internal line 22. Furthermore, since the directions of currents in the straight portions 21a and 22a are the same, that is, are parallel to each other, it is possible to more effectively improve a balance between the signals.

The via hole electrode 34e illustrated in FIG. 1A corresponds to the antenna terminal 2, and is electrically connected to a via hole electrode 46d extending downward. The internal lines 42 to 45 are connected to the ground potential. Since the internal lines 42 to 45 are not particularly important, the detailed description thereof will be omitted. At positions represented by relatively large circles in the internal lines 42 to 45, via hole electrodes extending downward are individually disposed.

As illustrated in FIG. 1C, on the top surface of the third insulating layer, a large electrode 51 connected to the ground potential is provided. The lower ends of the via hole electrodes connected to the internal lines 42 to 44 are electrically connected to the electrode 51. The via hole electrode 46a connected to the transmission terminal 5, the via hole electrode 46b connected to the first balanced terminal 6, and the via hole electrode 46c connected to the second balanced terminal 7 are connected to via hole electrodes 52, 53, and 54 extending downward from the third insulating layer, respectively.

The lower end of the via hole electrode 46d connected to the antenna terminal 2 is connected to a first end of a line 55 on the top surface. A via hole electrode 56 extending downward is formed at a second end of the line 55. Via hole electrode 46e is electrically connected to via hole electrode 58 extending downward. The upper ends of a plurality of via hole electrodes 59 are connected to the second surface of the electrode 51.

As illustrated in FIG. 1D, external electrodes 61 to 65 used for the external electric connection of the duplexer 1 are provided on a second surface 24b of the multilayer wiring board 24. The external electrode 61 is connected to the lower end of the via hole electrode 52, and is an electrode that is electrically connected to the transmission terminal 5. The external electrodes 62 and 63 are connected to the via hole electrodes 53 and 54, respectively, and are electrodes that are electrically connected to the first balanced terminal 6 and the second balanced terminal 7, respectively. The external electrode 64 is connected to the lower end of the via hole electrode 56, and is an electrode that is electrically connected to the antenna terminal 2. The external electrode 65 is electrically connected to the via hole electrodes 59 and the via hole electrodes 57 and 58, and is an electrode connected to the ground potential.

The external electric connection of the duplexer 1 can be achieved with the external electrodes 61 to 65.

Since the first internal line 21 and the second internal line 22 have the adjacent area A in which they are adjacent to each other in the receiver bandpass filter in the duplexer 1 according to the present preferred embodiment, it is possible to improve the balance between signals at the first and second balanced terminals. This point will be explained further with reference to specific experimental examples below.

According to an example of the above-described preferred embodiment, a duplexer for UMTS-Band 2 including a balanced-unbalanced transforming function was created. In this duplexer, an impedance at the unbalanced terminal 8 is 50Ω, an impedance at the first balanced terminal 6 and the second balanced terminal 7 is 100Ω, the transmitter filter 3 for UMTS-Band 2 has a passband of 1850 to 1910 MHz, and the receiver filter 4 has a passband of 1930 to 1990 MHz.

The transmitter filter 3 and the receiver filter 4 were created by forming Al electrodes on a 40°±5° Y-cut X-propagation LiTaO$_3$ substrate. The duplexer 1 illustrated in FIG. 3 was created by disposing such a surface acoustic wave filter chip on the multilayer wiring board 24 by face-down bonding.

The first elastic wave filter 11 to the fourth elastic wave filter 14 were designed as follows. In the following description, λI represents a wavelength that is determined in accordance with the pitch between electrode fingers in an IDT.

First Elastic Wave Filter 11 and Third Elastic Wave Filter 13
  Intersecting width=19.4 λI
  The number of electrode fingers in each of the first IDTs 11a and 13a and the third IDTs 11c and 13c is 33 including three narrow-pitch electrode fingers. That is, a narrow-pitch electrode finger portion including three electrode fingers was disposed at the end portions of the first IDT 11a and the third IDT 11c on the side of the second IDT 11b and the end portions of the first IDT 13a and the third IDT 13c on the side of the second IDT 13b.
  The number of electrode fingers in each of the second IDTs 11b and 13b is 34 including 14 electrode fingers in narrow-pitch electrode finger portions disposed on either side. That is, a narrow-pitch electrode finger portion including seven electrode fingers was disposed on either side of each of the second IDTs 11b and 13b in an elastic wave propagation direction.
  The number of electrode fingers in each of the reflectors 11d, 11e, 13d, and 13e is 75.
  Metallization ratio=0.70
  Electrode film thickness: 0.087 λI Second Elastic Wave Filter 12 and Fourth Elastic Wave Filter 14
  Intersecting width=16.5 λI
  The number of electrode fingers in each of the first IDTs 12a and 14a and the third IDTs 12c and 14c is 33 including three narrow-pitch electrode fingers. That is, a narrow-pitch electrode finger portion including three electrode fingers was disposed at the end portions of the first IDT 12a and the third IDT 12c on the side of the second IDT 12b and the end portions of the first IDT 14a and the third IDT 14c on the side of the second IDT 14b.
  The number of electrode fingers in each of the second IDTs 12b and 14b is 38 including 12 electrode fingers in narrow-pitch electrode finger portions disposed on either side. That is, a narrow-pitch electrode finger portion including six electrode fingers was disposed on either side of each of the second IDTs 12b and 14b in an elastic wave propagation direction.
  The number of electrode fingers in each of the reflectors 12d, 12e, 14d, and 14e is 75.
  Metallization ratio: 0.70
  Electrode film thickness: 0.087 λI One-Port Elastic Wave Resonator 9
  Intersecting width=14.7 λI
  The number of electrode fingers in an IDT is 201.
  The number of electrode fingers in a reflector is 18.
  Metallization ratio: 0.60
  Electrode film thickness: 0.089 λI A duplexer that is a comparative example was created. The configuration of the created duplexer is similar to that of a duplexer according to the above-described preferred embodiments except for that a multilayer board having an electrode structure illustrated in FIGS. 4A to 4D is used in the created duplexer. A multilayer wiring board 1101 in a duplexer that is a comparative example has the same electrode structure as that of a duplexer according to the above-described preferred embodiments on a top surface 1101*a* and a second surface 1101*b*. The difference between a duplexer that is a comparative example and a duplexer according to the above-described preferred embodiments is that the direction of a current passing through a first internal line 1121 and the direction of a current passing through a second internal line 1122 are opposite as represented by arrows in the adjacent area A in which the first internal line 1121 and the second internal line 1122 are adjacent to each other on the top surface of the second insulating layer in FIG. 4B. Accordingly, on the top surface of a third insulating layer in FIG. 4C, the positions of via hole electrodes 53 and 54 are different from those described in the above-described preferred embodiments. A duplexer that is a comparative example has a configuration similar to that of a duplexer according to the above-described preferred embodiments except for the above-described points.

Figure 5:
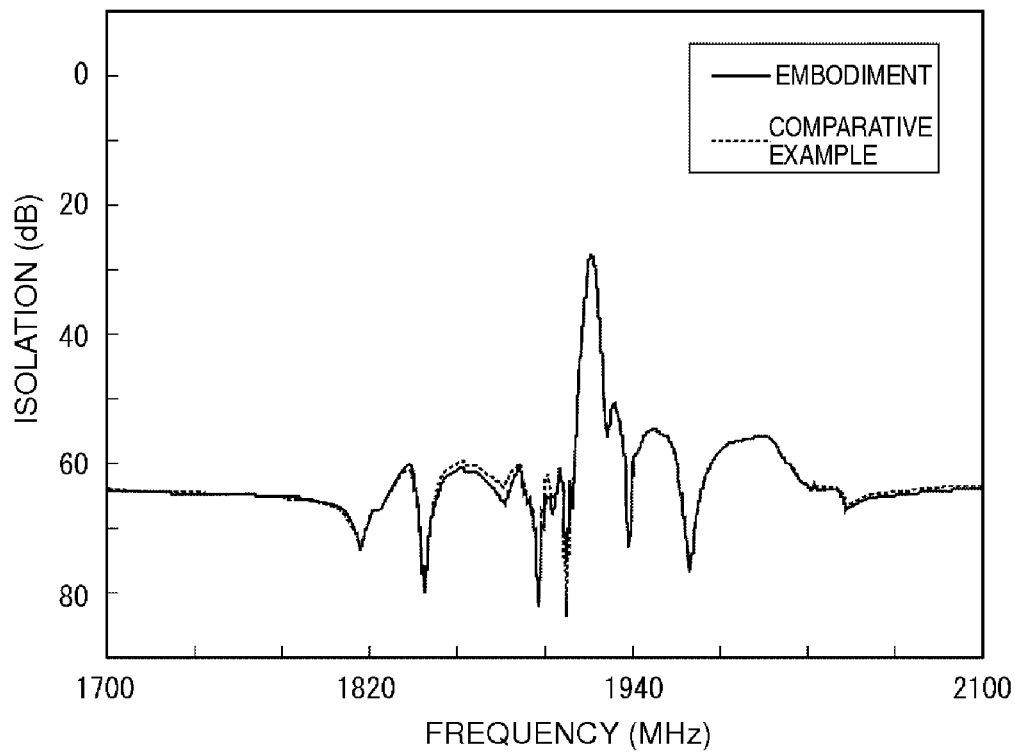
FIG. 5 is a diagram illustrating isolation characteristics of an elastic wave apparatus according to the first preferred embodiment of the present invention and an elastic wave apparatus that is a comparative example.

FIG. 5 is a diagram illustrating an isolation characteristic between a transmitter side and a receiver side. In FIG. 5, a solid line represents an isolation characteristic obtained when a preferred embodiment of the present invention is used and a broken line represents an isolation characteristic obtained when a comparative example is used. As is apparent from FIG. 5, according to a preferred embodiment of the present invention, an isolation characteristic is improved by approximately 2 dB in a transmission passband as compared with a comparative example.

Figure 6:
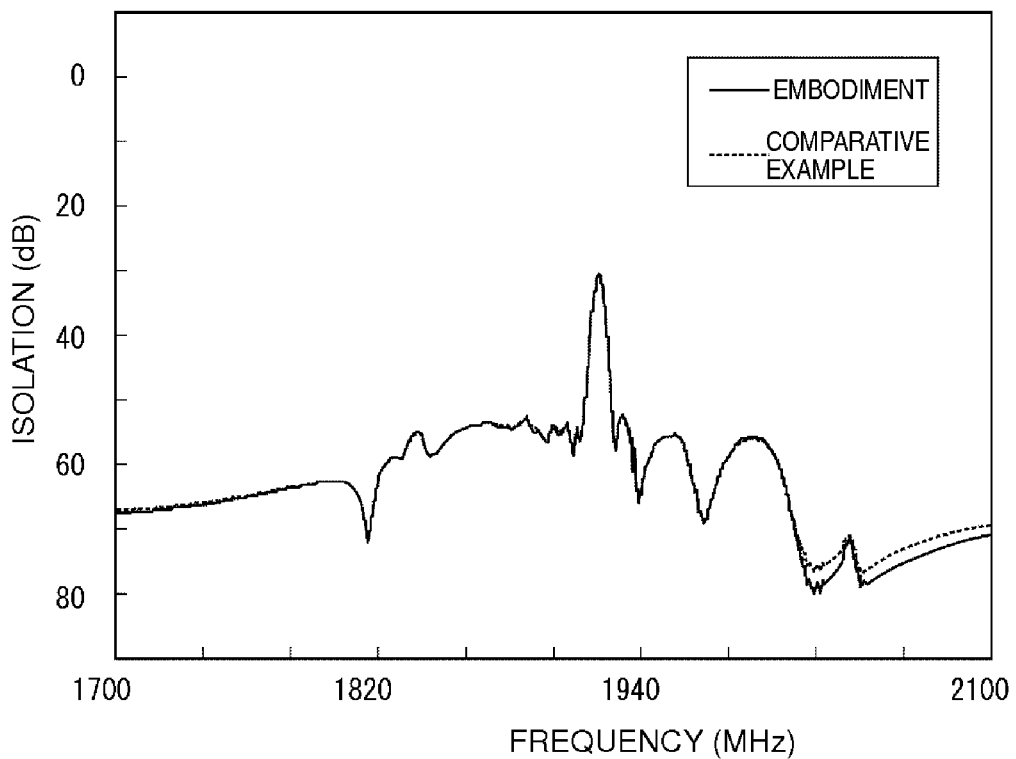
FIG. 6 is a diagram illustrating isolation characteristics between a transmitter filter and a first balanced terminal in an elastic wave apparatus according to the first preferred embodiment of the present invention and an elastic wave apparatus that is a comparative example.
Figure 7:
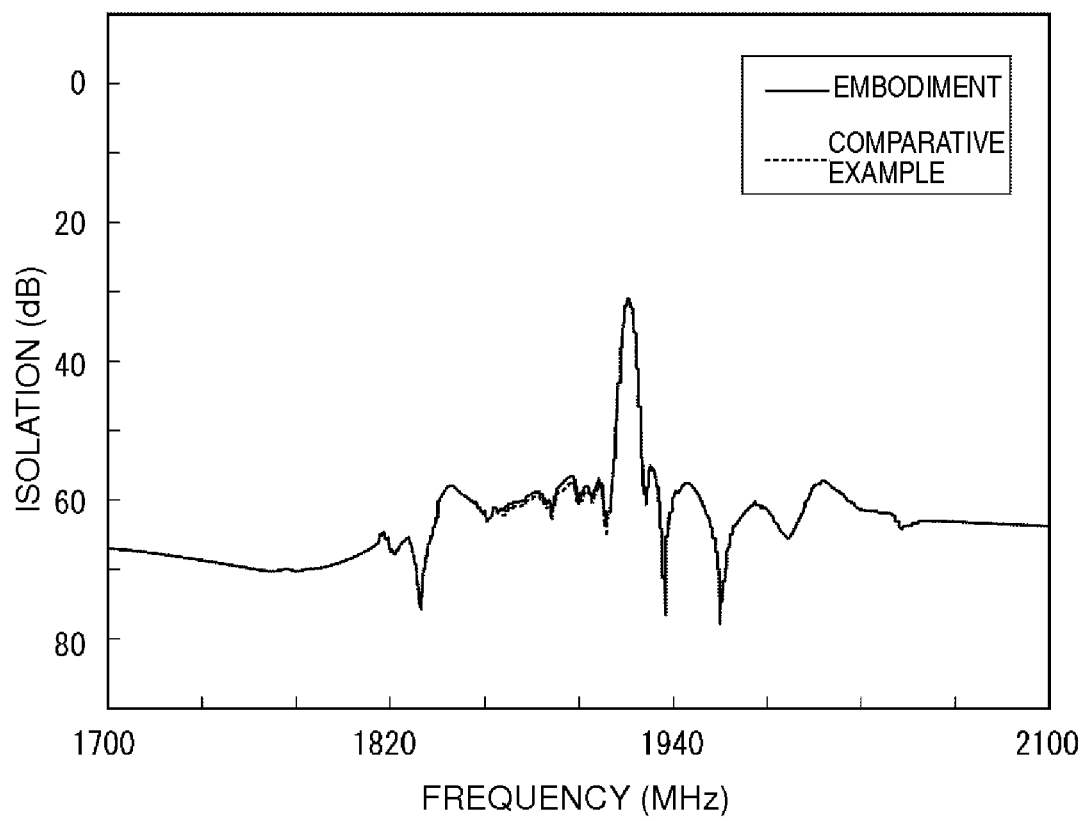
FIG. 7 is a diagram illustrating isolation characteristics between a transmitter filter and a second balanced terminal in an elastic wave apparatus according to the first preferred embodiment of the present invention and an elastic wave apparatus that is a comparative example.

FIG. 6 is a diagram illustrating an isolation characteristic between a transmitter side and a first balanced terminal. FIG. 7 is a diagram illustrating an isolation characteristic between a transmitter side and a second balanced terminal. In FIGS. 6 and 7, a solid line represents an isolation characteristic obtained when a preferred embodiment of the present invention is used and a broken line represents an isolation characteristic obtained when a comparative example is used.

When a comparative example is used, the second balanced terminal has an isolation value larger than that of the first balanced terminal in a transmission passband. When a preferred embodiment of the present invention is used, the first balanced terminal has an isolation characteristic larger than that obtained when the comparative example is used in the transmission passband and the second balanced terminal has an isolation characteristic smaller than that obtained when the comparative example is used in the transmission passband. That is, with the improvement of a balance, an isolation characteristic in the transmission passband is improved as illustrated in FIG. 5.

That is, according to the above-described preferred embodiments, since the directions of currents passing through the first internal line 21 and the second internal line 22 are the same in an adjacent area where the first internal line 21 and the second internal line 22 are adjacent to each other, that is, since currents having different phases flow in the same direction, a parasitic capacitance generated between the first internal line 21 and the second internal line 22 passes a small current between the first internal line 21 and the second internal line 22. It is considered that the small current corrects the balance between the first balanced terminal 6 and the second balanced terminal 7. As a result, as illustrated in FIG. 5, according to the above-described preferred embodiments, an isolation characteristic is improved as compared with a case in which a comparative example is used.

In the above-described preferred embodiments, a floating balanced type elastic wave filter is preferably used as the receiver filter 4. It is considered that an effect similar to the above-described effect is obtained when a neutral-point type balanced elastic wave filter is used. The degree of a balance in a floating balanced type elastic wave filter is smaller than that in a neutral-point type balanced elastic wave filter. Accordingly, a greater effect of preferred embodiments of the present invention can be obtained when a floating balanced type elastic wave filter is used.

In floating balanced type elastic wave filters, a long line is usually used in a multilayer wiring board. Accordingly, according to various preferred embodiments of the present invention, the deterioration of a balance can be more effectively prevented when a floating balanced type elastic wave filter is used. It is therefore possible to provide a balanced duplexer having an excellent isolation characteristic which includes a floating balanced type elastic wave filter having an excellent isolation characteristic in the passband of a transmitter filter as a receiver filter.

FIGS. 8A to 8D are schematic plan views illustrating electrode structures on the surface of a multilayer wiring board, the top surface of a second insulating layer, the top surface of a third insulating layer, and the second surface of the third insulating layer, respectively, in a duplexer according to a second preferred embodiment of the present invention.

In the first preferred embodiment, the first internal line 21 and the second internal line 22 are preferably adjacent to each other in the adjacent area A on the top surface of the second insulating layer. As illustrated in FIGS. 8B and 8C, the first internal line 21 and the second internal line 22 may be provided on different insulating layers. That is, in the second preferred embodiment, the first internal line 21 is preferably provided on the top surface of the third insulating layer as illustrated in FIG. 8C, the second internal line 22 is preferably provided on the top surface of the second insulating layer as illustrated in FIG. 8B, and the first internal line 21 and the second internal line 22 are adjacent to each other with the second insulating layer there between. Like in the first preferred embodiment, in the second preferred embodiment, an adjacent area where the straight portion 21*a* of the first internal line 21 and the straight portion 22*a* of the second internal line 22 are adjacent to each other is provided, and the directions of currents passing through the first internal line 21 and the second internal line 22 are the same in the adjacent area.

Accordingly, like in the first preferred embodiment, in the second preferred embodiment, the improvement of a balance can be achieved. The configuration of a duplexer according to the second preferred embodiment is the same as that of a duplexer according to the first preferred embodiment except for the above-described point. The same reference numerals are used to identify elements already described in the first preferred embodiment, and the descriptions thereof will be therefore omitted.

In the first and second preferred embodiments, a capacitance is obtained in an adjacent area where a first internal line and a second internal line are adjacent to each other and a balance is improved with the obtained capacitance. The level of the capacitance is determined in accordance with the lengths and/or shapes of the first internal line 21 and the second internal line 22. The lengths and/or shapes of the first internal line 21 and the second internal line 22 are set so that a capacitance with which a balance can be improved can be obtained in an adjacent area where the first internal line 21 and the second internal line 22 are adjacent to each other. Accordingly, the shapes and positions of the first internal line 21 and the second internal line 22 may be changed on the condition that such a capacitance can be obtained.

In the duplexer 1 including the above-described elastic wave filter, a surface acoustic wave filter element for a surface acoustic wave is preferably used. A boundary acoustic wave filter element for a boundary acoustic wave may be used.

Figure 9:
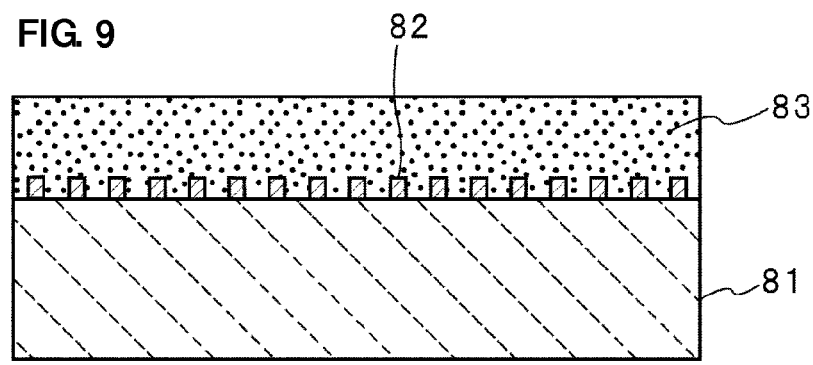
FIG. 9 is a schematic elevational cross-sectional view illustrating a boundary acoustic wave element.
Figure 10:
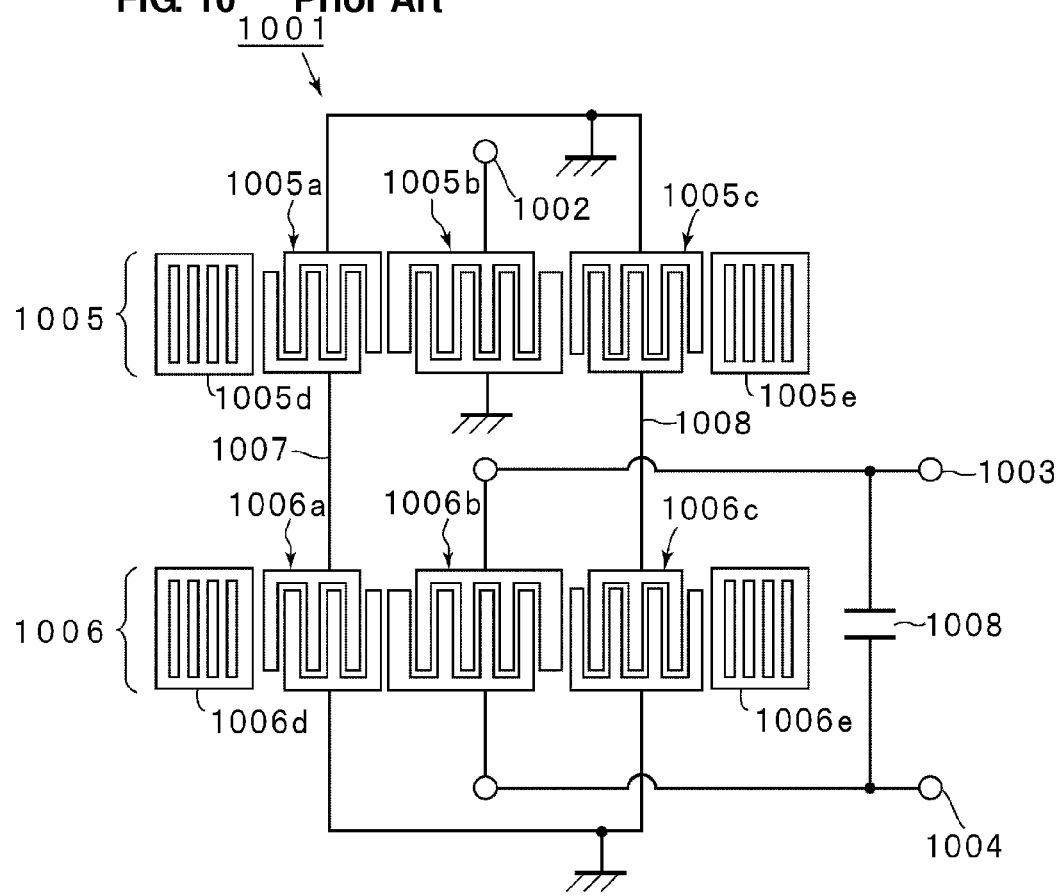
FIG. 10 is a schematic plan view illustrating an electrode structure of a surface acoustic wave apparatus according to the related art.
Figure 11:
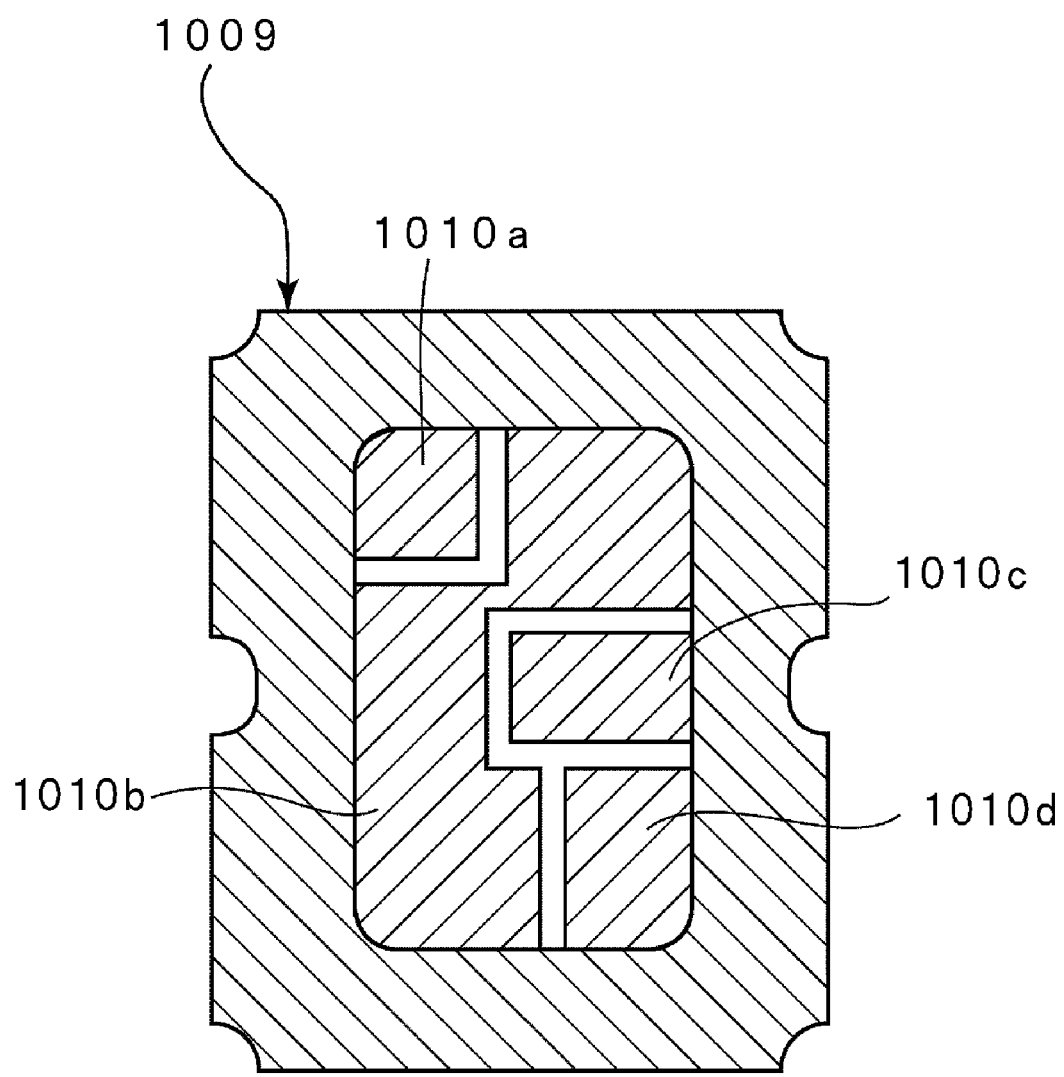
FIG. 11 is a schematic plan view describing an electrode structure of a die attach portion in a package in a surface acoustic wave filter apparatus according to the related art.

FIG. 9 is a schematic elevational cross-sectional view illustrating the general configuration of a boundary acoustic wave element. In a boundary acoustic wave element, electrodes including IDT electrodes 82 are provided on a piezoelectric substrate 81 and these electrodes are covered with a dielectric layer 83. A boundary acoustic wave propagates on the interface between the dielectric layer 83 and the piezoelectric substrate 81 and is enclosed.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave apparatus comprising:
    a longitudinally coupled resonator-type elastic wave filter element including an unbalanced terminal, a first balanced terminal, a second balanced terminal, and a ground terminal;
    a multilayer wiring board including a main surface and a second surface, the main surface including the elastic wave filter element mounted thereon in a face-down arrangement;
    a plurality of electrodes provided on the main surface of the multilayer wiring board and individually connected to the unbalanced terminal, the first and second balanced terminals, and the ground terminal in the elastic wave filter element;
    a plurality of external electrodes provided on the second surface of the multilayer wiring board; and
    a plurality of internal lines provided in the multilayer wiring board and arranged to individually electrically connect the plurality of electrodes and the plurality of external electrodes; wherein
    the plurality of internal lines include a first internal line connected to the first balanced terminal and a second internal line connected to the second balanced terminal;
    lengths and/or shapes of the first and second internal lines are different so as to improve a balance between a signal obtained from the first balanced terminal and a signal obtained from the second balanced terminal;
    a capacitance component is generated in an adjacent area where portions of the first and second internal lines are adjacent to each other;
    a direction of a current passing through the first internal line and a direction of a current passing through the second internal line are the same in the adjacent area;
    the adjacent area is located on one of a plurality of insulating layers provided in the multilayer wiring board; and
    the first and second internal lines are adjacent to each other with at least one of the plurality of insulating layers therebetween so as to define the adjacent area.

2. The elastic wave apparatus according to claim 1, wherein the elastic wave filter element is a floating balanced type elastic wave filter element.

3. The elastic wave apparatus according to claim 1, wherein the elastic wave filter element is a surface acoustic wave filter element.

4. The elastic wave apparatus according to claim 1, wherein the elastic wave filter element is a boundary acoustic wave filter element.

5. A duplexer comprising:
    a transmitter filter; and
    a receiver filter defined by the elastic wave apparatus according to claim 1.

* * * * *